US008201947B2

(12) United States Patent
Chen et al.

(10) Patent No.: US 8,201,947 B2
(45) Date of Patent: Jun. 19, 2012

(54) WAVELENGTH CONVERTER AND GREEN LIGHT SOURCE AND PROJECTION APPARATUS USING THE SAME

(75) Inventors: Yi Zhong Chen, Hsinchu (TW); Shang Ling Liu, Hsinchu (TW); Ming Hsien Chou, Hsinchu (TW)

(73) Assignee: HC Photonics Corp., Hsinchu (TW)

( * ) Notice: Subject to any disclaimer, the term of this patent is extended or adjusted under 35 U.S.C. 154(b) by 378 days.

(21) Appl. No.: 12/630,389

(22) Filed: Dec. 3, 2009

(65) Prior Publication Data

US 2010/0141896 A1 Jun. 10, 2010

Related U.S. Application Data

(60) Provisional application No. 61/121,323, filed on Dec. 10, 2008.

(51) Int. Cl.

| | |
|---|---|
| ***G03B 21/26*** | (2006.01) |
| ***H01S 5/00*** | (2006.01) |
| ***G02B 26/08*** | (2006.01) |
| ***G02F 1/35*** | (2006.01) |
| ***G02F 1/1335*** | (2006.01) |
| ***G02F 1/295*** | (2006.01) |
| ***C30B 19/00*** | (2006.01) |

(52) U.S. Cl. ...... 353/31; 353/94; 372/50.11; 359/202.1; 359/326; 349/62; 117/56; 385/10

(58) Field of Classification Search .................... 353/31, 353/94; 372/10, 50.11; 348/754; 359/202.1, 359/326; 275/295; 349/62; 117/56; 385/10

See application file for complete search history.

(56) References Cited

U.S. PATENT DOCUMENTS

| | | | |
|---|---|---|---|
| 6,129,864 | A | 10/2000 | Imaeda et al. |
| 6,631,231 | B2 | 10/2003 | Mizuuchi et al. |
| 7,171,094 | B2 | 1/2007 | Mizuuchi et al. |
| 7,236,674 | B2 | 6/2007 | Mizuuchi et al. |
| 2005/0253055 | A1 | 11/2005 | Sprague et al. |

*Primary Examiner* — Georgia Y Epps
*Assistant Examiner* — Magda Cruz
(74) *Attorney, Agent, or Firm* — WPAT, P.C.; Anthony King

(57) ABSTRACT

A wavelength converter includes a supporting substrate and a ferroelectric substrate, the ferroelectric substrate includes at least one waveguide facing the supporting substrate and at least one wavelength-filtering pattern positioned between the waveguide and the supporting substrate, the waveguide includes a plurality of inverted domains and non-inverted domains configured to convert an infrared light into a green light, and the infrared light emitted from the semiconductor laser enters the waveguide of the wavelength converter. For example, the wavelength-filtering pattern includes a Bragg grating.

14 Claims, 6 Drawing Sheets

WAVELENGTH CONVERTER AND GREEN LIGHT SOURCE AND PROJECTION APPARATUS USING THE SAME

BACKGROUND OF THE INVENTION (A) Field of the Invention

The present invention relates to a wavelength converter and green light source and projection apparatus using the same, and more particularly, to a wavelength converter equipped with light-filtering pattern and green light source and projection apparatus using the same.

(B) Description of the Related Art

Quasi-phase matching (QPM) is a technique for phase matching nonlinear optical interactions in which the relative phase is corrected at regular intervals using a structural periodicity built into the nonlinear medium, and the most popular case of interest in modern QPM technology is called frequency doubling or second harmonic generation (SHG).

U.S. Pat. No. 6,129,864 discloses a process for producing an optical waveguide substrate including a ridge-shaped structural portion containing at least an optical waveguide, with such process including the steps of forming an optical waveguide-forming layer on a substrate body to prepare a substrate workpiece, and forming said ridge-shaped structural portion at said substrate workpiece by grinding.

U.S. Pat. No. 6,631,231 B2 discloses an optical waveguide element including a three-dimensional optical waveguide of a bulky non-linear optical crystal, a substrate, and a joining layer made of an amorphous material. The substrate is joined to the optical waveguide via the joining layer.

U.S. Pat. No. 7,171,094 B2 discloses an optical waveguide device including a waveguide layer that converts a wavelength of incident light and emits converted light. In the waveguide layer, a ridge waveguide and slab waveguides are provided, the slab waveguides being formed on both sides of the ridge waveguide with recess portions intervening therebetween. The waveguide layer satisfies a multi-mode condition for the incident light, and light propagating through the ridge waveguide is in a single mode.

U.S. Pat. No. 7,236,674 B2 discloses an optical waveguide device having a substrate composed of a nonlinear optical material and a periodically domain-inverted structure having the same composition as the nonlinear optical material, where the domain-inverted structure has a refractive index distribution relying on the domain-inverted structure.

US 2005/0253055 discloses an MEMS oscillator, such as an MEMS scanner, which has an improved and simplified drive scheme and structure. Drive impulses may be transmitted to an oscillating mass via torque through the support arms. For multi-axis oscillators drive signals for two or more axes may be superimposed by a driver circuit and transmitted to the MEMS oscillator. The oscillator responds in each axis according to its resonance frequency in that axis. The oscillator may be driven resonantly in some or all axes. Improved load distribution results in reduced deformation. A simplified structure offers multi-axis oscillation using a single moving body. Another structure directly drives a plurality of moving bodies. Another structure eliminates actuators from one or more moving bodies, those bodies being driven by their support arms.

SUMMARY OF THE INVENTION

One aspect of the present invention provides a wavelength converter equipped with light-filtering pattern and green light source and projection apparatus using the same.

A wavelength converter according to this aspect of the present invention comprises a supporting substrate and a ferroelectric substrate. The ferroelectric substrate includes at least one ridge waveguide facing the supporting substrate and at least one wavelength-filtering pattern positioned between the ridge waveguide and the supporting substrate, wherein the ridge waveguide includes a plurality of inverted domains and non-inverted domains. The ridge waveguide is joined on the supporting substrate via an adhesive, and the light-filtering pattern includes a Bragg grating.

Another aspect of the present invention provides a green light source comprising a semiconductor laser configured to emit an infrared light and a wavelength converter configured to convert the infrared light into a green light. The wavelength converter includes a supporting substrate and a ferroelectric substrate, the ferroelectric substrate includes at least one ridge waveguide facing the supporting substrate and at least one wavelength-filtering pattern positioned between the ridge waveguide and the supporting substrate, the ridge waveguide includes a plurality of inverted domains and non-inverted domains configured to convert the infrared light into the green light, and the infrared light emitted from the semiconductor laser enters the ridge waveguide of the wavelength converter.

Another aspect of the present invention provides a projection apparatus, comprising a light source including a green unit configured to emit a green light, a blue unit configured to emit a blue light and red unit configured to emit a red light, wherein the green unit includes an infrared laser configured to emit an infrared light and a wavelength converter configured to convert the infrared light into a green light. The wavelength converter includes a supporting substrate and a ferroelectric substrate, the ferroelectric substrate includes at least one ridge waveguide facing the supporting substrate and at least one wavelength-filtering pattern positioned between the ridge waveguide and the supporting substrate, the ridge waveguide includes a plurality of inverted domains and non-inverted domains configured to convert the infrared light into the green light, and the infrared light emitted from the semiconductor laser enters the ridge waveguide of the wavelength converter.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
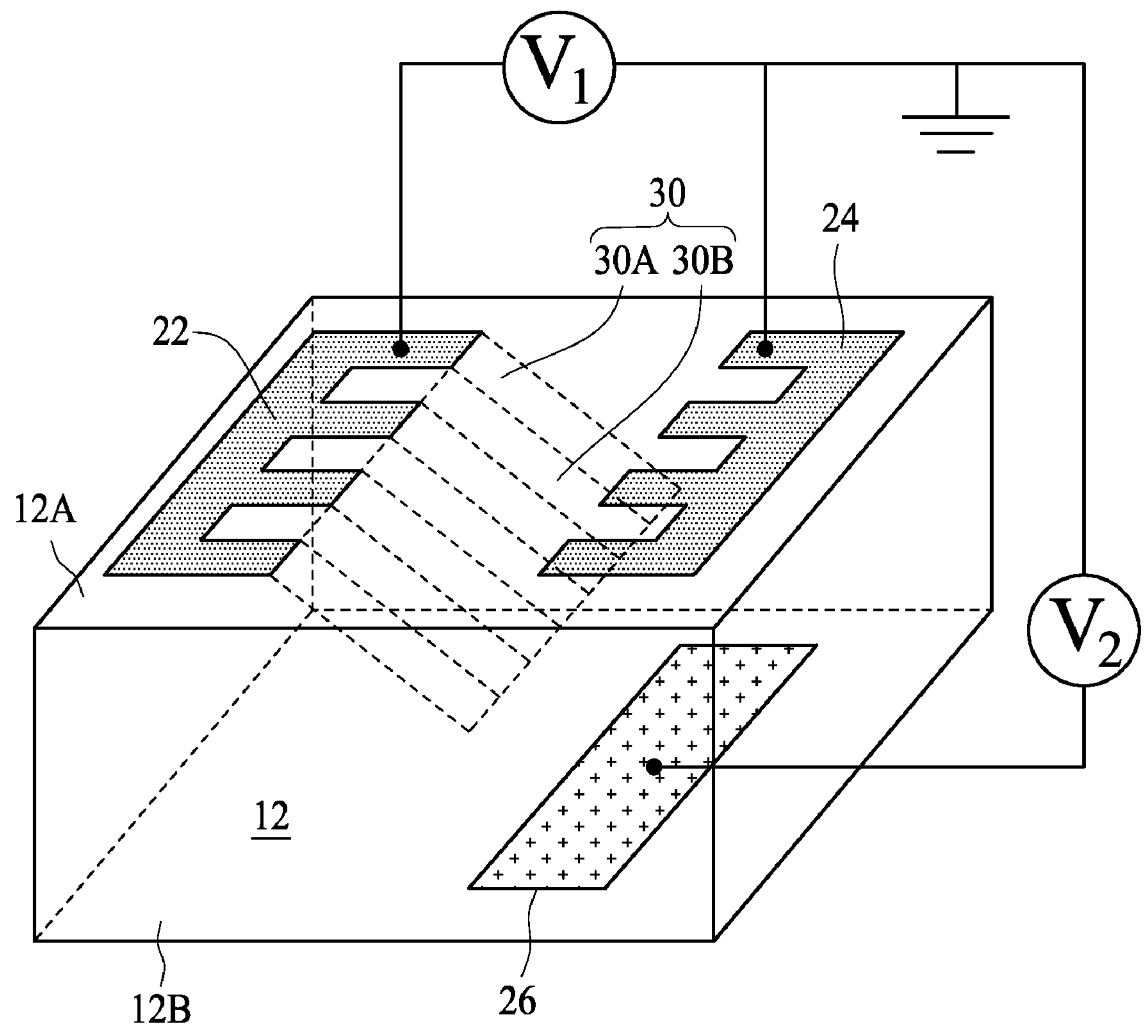
FIG. 1 to FIG. 5 illustrate a method for preparing a wavelength converter according to one embodiment of the present invention.

FIG. 1 to FIG. 5 illustrate a method for preparing a wavelength converter 10 according to one embodiment of the present invention. Deposition and etching processes are performed to form an electrode structure 20 including a first electrode 22 and a second electrode 24 on a first side (e.g. top surface 12A) of a ferroelectric substrate 12 and a third electrode 26 on a second side (e.g. bottom surface 12B) of the ferroelectric substrate 12 such as lithium niobate. In one embodiment of the present disclosure, the first electrode 22 and the second electrode 24 can be comb-shaped, and the second electrode 24 is positioned on the top surface 12A as a mirror image of the first electrode 22, i.e., the finger portion of the first comb-shaped electrode 22 directs to that of the second comb-shaped electrode 24.

A poling process is performed on the electrode structure 20 by applying predetermined voltages to the electrode structure 20 to form a periodic poled region 30 in the ferroelectric substrate 12. The periodic poled region 30 includes a plurality of inverted domains 30A having a first polarization direction and a plurality of non-inverted domains 30B interleaved between the inverted domains 30A, wherein the non-inverted domain 30B has a second polarization direction substantially opposite to the first polarization direction. Preferably, the poling process is performed by applying a first voltage to the first comb-shaped electrode 22, a second voltage to the second comb-shaped electrode 24 and a third voltage to the third electrode 26. Preferably, the first voltage is higher than the second voltage, the first voltage is higher than the third voltage, and the third voltage is higher than or equal to the second voltage.

Figure 2:
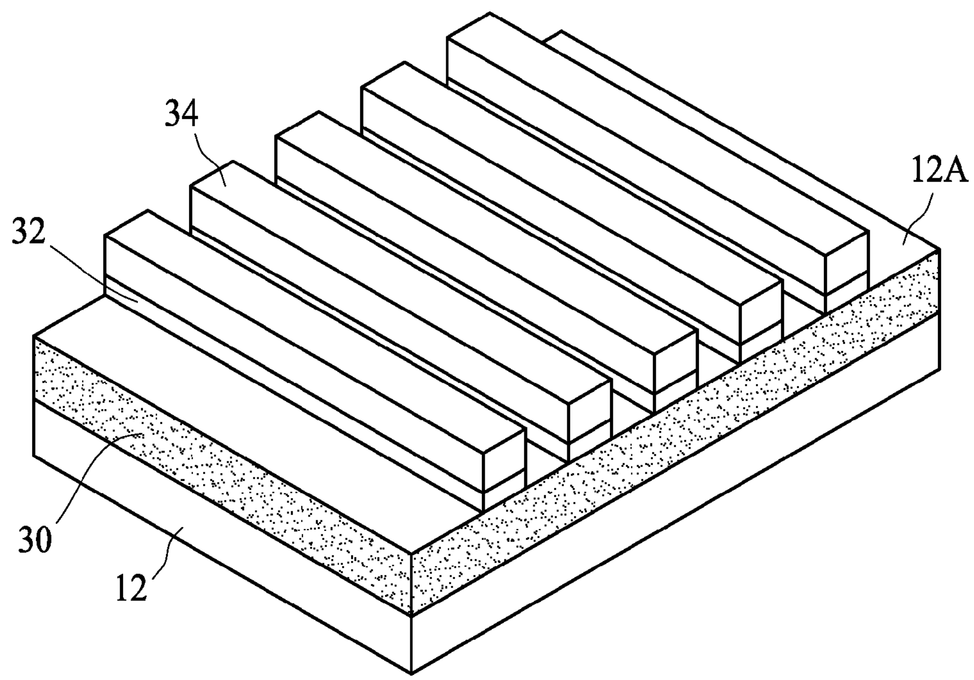

Referring to FIG. 2, the first comb-shaped electrode 22, the second comb-shaped electrode 24 and the third electrode 26 are removed from the ferroelectric substrate 12, and a dielectric layer such as a titanium oxide layer 32 is then formed on the top surface 12A of the ferroelectric substrate 12 by the deposition process. Subsequently, a mask layer 34 having lateral strip patterns is formed on a portion of the dielectric layer 32 by deposition and lithographic processes, an etching process is then performed to remove a portion of the dielectric layer 32 not covered by the mask layer 34, and the mask layer 34 is then removed.

Figure 3:
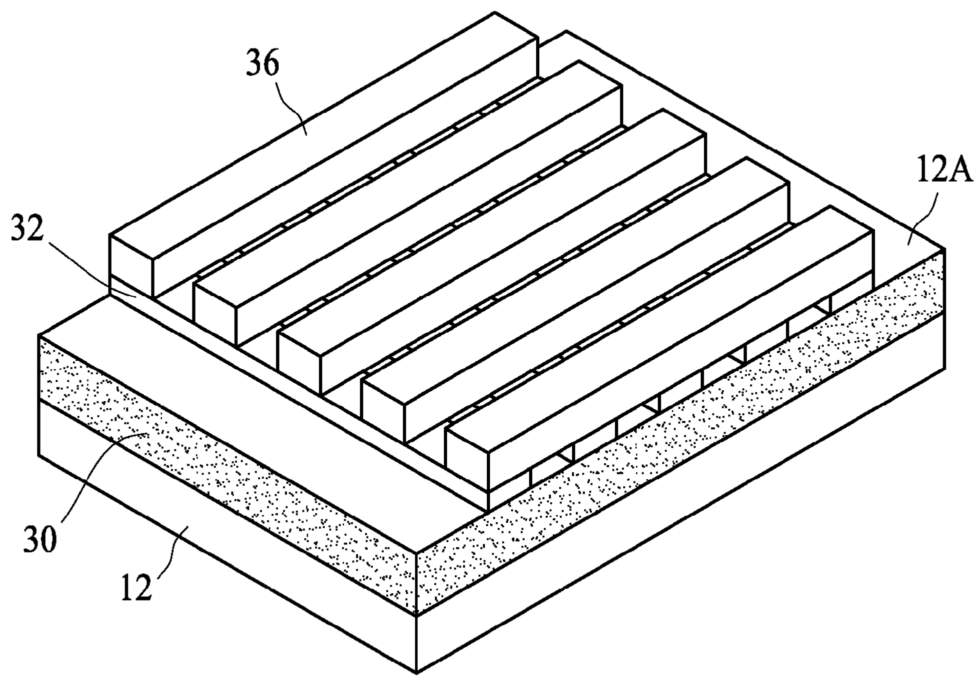
Figure 4:
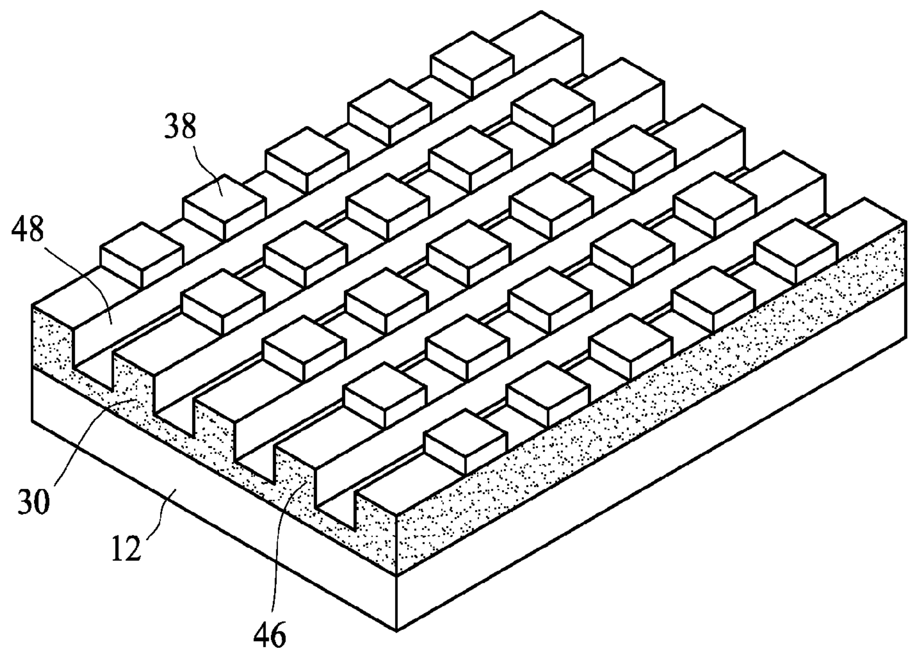

Referring to FIG. 3, a mask layer 36 having longitudinal strip patterns is formed on a portion of the dielectric layer 32 and the ferroelectric substrate 12 by deposition and lithographic processes, and an etching process is then performed to remove a portion of the dielectric layer 32 and the periodic poled region 30 not covered by the mask layer 36, and the mask layer 36 is then removed. In particular, the etching process removes a portion of the ferroelectric substrate 12 inside the periodic poled region 30 to form a plurality of ridge waveguides 46 and a plurality of wavelength-filtering pattern 38 such as the Bragg grating directly on the ridge waveguides 46, as shown in FIG. 4. The ridge waveguides 46 are separated by air gaps 48 and may have different profiles and sizes.

Figure 5:
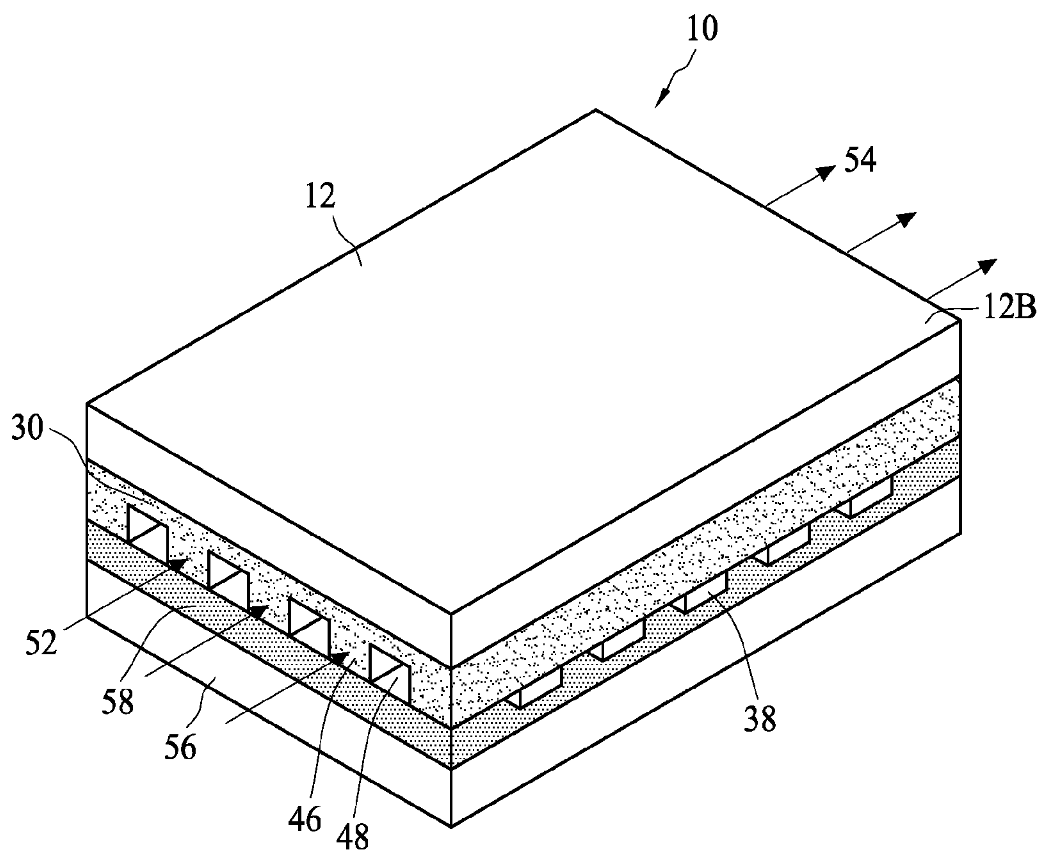

Referring to FIG. 5, the top surface 12A of the ferroelectric substrate 12 is joined to a supporting substrate 56 in an upside-down manner. In one embodiment of the present disclosure, the ferroelectric substrate 12 is joined to a supporting substrate 56 via an adhesive 58, and the refraction index of the adhesive 58 is smaller than the refraction index of the ferroelectric substrate 12. The adhesive 58 may fill at least a portion of the air gaps 48 or completely fill the air gaps 48. In particular, the ridge waveguide 46 faces the supporting substrate 56 and the wavelength-filtering pattern 38 is positioned between the ridge waveguide 48 and the supporting substrate 56. A polishing process can be performed on the bottom surface 12B of the ferroelectric substrate 12 to reduce the thickness of the ferroelectric substrate 12, i.e., to reduce the size of the ferroelectric substrate 12. Subsequently, deposition and etching processes may be optionally performed to form at least one controlling pattern such as conductive wires on the bottom surface 12B of the ferroelectric substrate 12. Since the wavelength-filtering pattern 38 is positioned between the ridge waveguide 48 and the supporting substrate 56, the subsequent polishing process, deposition process and etching process can be performed on the bottom surface 12B of the ferroelectric substrate 12 without damaging the wavelength-filtering pattern 38.

Referring back to FIG. 1, the periodic poled region 30 includes a plurality of inverted domains 30A having a first polarization direction and a plurality of non-inverted domains 30B interleaved between the inverted domains 30A, wherein the non-inverted domain 30B has a second polarization direction substantially opposite to the first polarization direction. In other words, each of the ridge waveguides 48 includes the inverted domains 30A and the non-inverted domains 30B interleaved between the inverted domains 30A. The size and arrangement of the inverted domains 30A and the non-inverted domains 30B are designed to convert an infrared light 52 into a green light 54 through the second harmonic generation (SHG) mechanism, as shown in FIG. 5.

Figure 6:
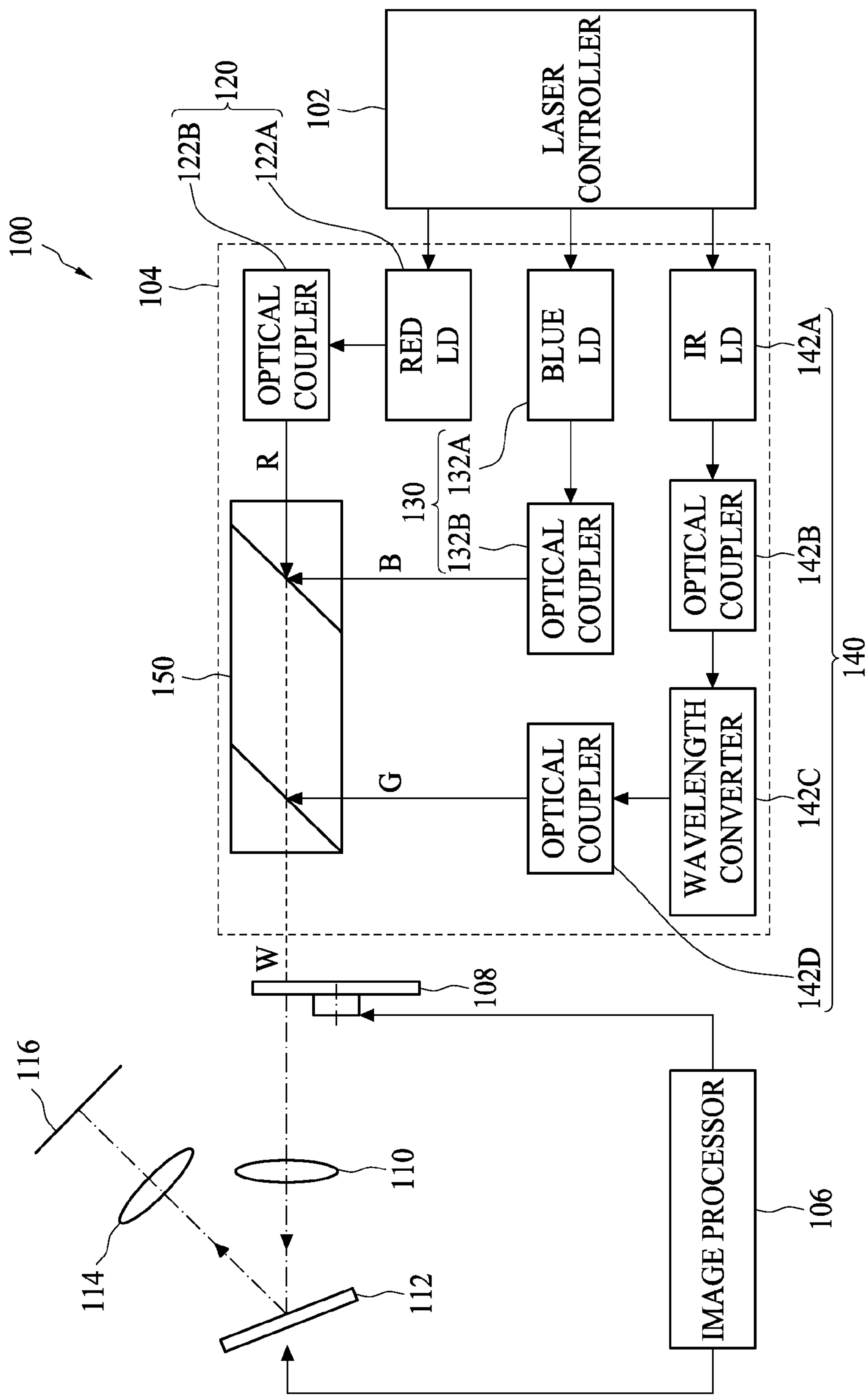
FIG. 6 illustrates a projection apparatus according to one embodiment of the present invention.

FIG. 6 illustrates a projection apparatus 100 according to one embodiment of the present invention. The projection apparatus 100 comprises a light source 104, a color wheel 108, a relay lens 110, a light modulator such as a micromirror device 112, a projection lens 114 and an image-displaying device 116 such as a screen of a video wall. The light source 104 includes a green unit 140 configured to emit a green light, a blue unit 130 configured to emit a blue light and red unit 120 configured to emit a red light. The green unit 140 includes an infrared laser 142A configured to emit an infrared light, a wavelength converter 142C (such as the wavelength converter 10 shown in FIG. 5) configured to convert the infrared light into a green light, an optical coupler 142B such as a fiber lens configured to couple the infrared light to the wavelength converter 142C, and an optical coupler 142B configured to couple the green light from the wavelength converter 142C to a beam combiner 150.

The blue unit 130 includes a blue laser 132A configured to emit a blue light and an optical coupler 132B configured to couple the blue light from the blue laser 132A to the beam combiner 150. The red unit 120 includes a red laser 122A configured to emit a red light and an optical coupler 122B configured to couple the red light from the blue laser 122A to the beam combiner 150. The beam combiner 150 is configured to combine the green light, the blue light and the red light to produce a white light. The color wheel 108 is configured to receive the white light from the beam combiner 150 and generate light beams of different wavelength bands at different times, the light modulator 112 is configured to receive the light beams of different wavelength bands at different times from the color wheel 108 and supply image signals corresponding to the wavelength bands of the light beams to modulate the received light beams to optical images of different wavelength bands at different times, and the projection lens 114 is configured to project the optical images modulated by the light modulator 112. The micromirror device 112 and the color wheel 108 are controlled by an image controller 106, and the red laser 122A, the blue laser 132A and the infrared laser 142A are controlled by a laser controller 102.

Figure 7:
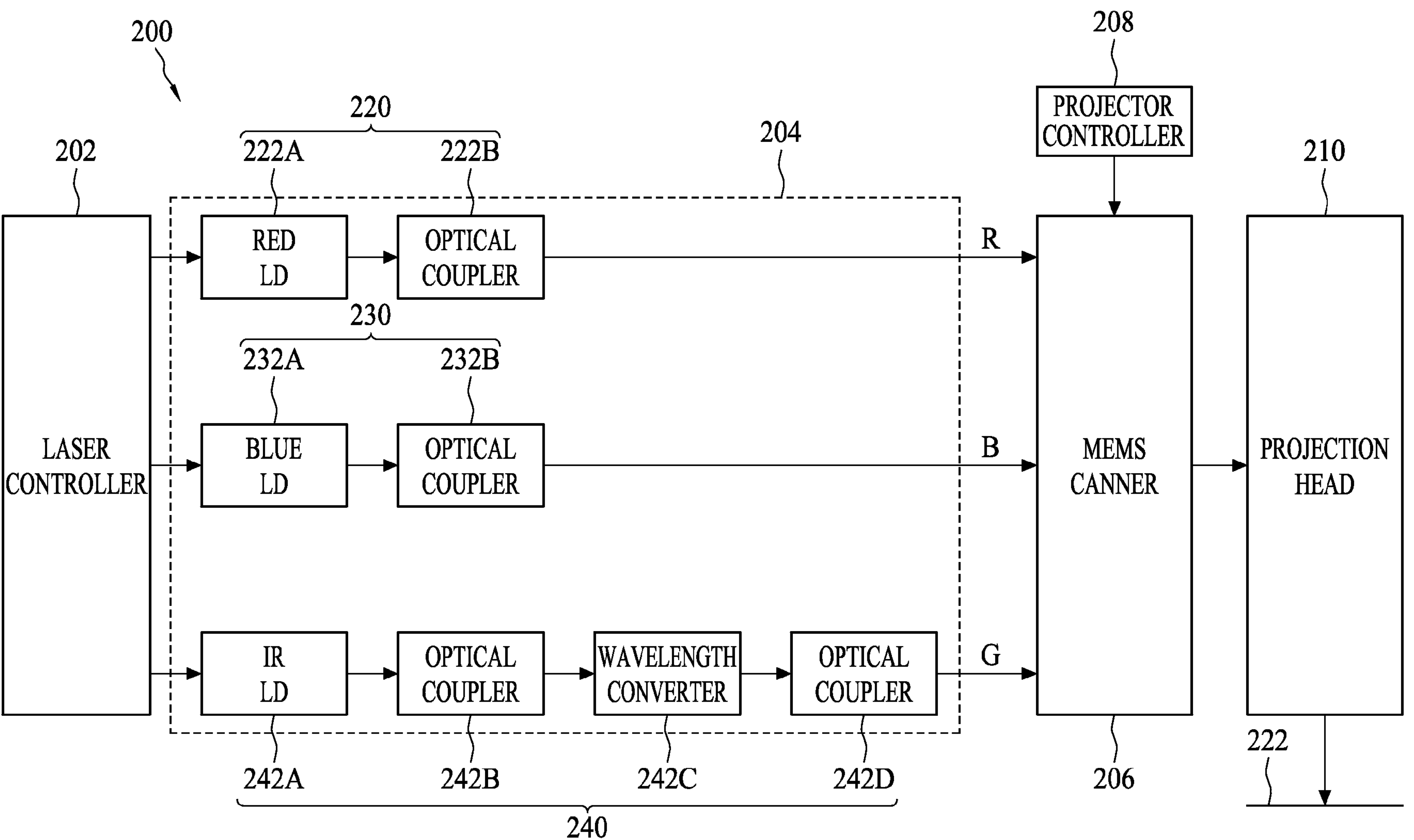
FIG. 7 illustrates a projection apparatus according to another embodiment of the present invention.

FIG. 7 illustrates a projection apparatus 200 according to another embodiment of the present invention. The projection apparatus 200 comprises a light source 204, a scanner 206 and a projection head 220, wherein the scanner 206 is controlled by a projection processor 208 to reflect the lights from the light source 204 onto a display screen 222 via the projection head 220. The light source 204 includes a green unit 240 configured to emit a green light, a blue unit 230 configured to emit a blue light and red unit 220 configured to emit a red light. US 2005/0253055 discloses the MEMS scanner, which is suitable for the scanner 206 of the projection apparatus 200, and the disclosure of US 2005/0253055 is incorporated herein for reference.

The green unit 240 includes an infrared laser 242A configured to emit an infrared light, a wavelength converter 242C (such as the wavelength converter 20 shown in FIG. 5) configured to convert the infrared light into a green light, an optical coupler 242B such as a fiber lens configured to couple the infrared light to the wavelength converter 242C, and an optical coupler 242B configured to couple the green light from the wavelength converter 242C to the scanner 206. The blue unit 230 includes a blue laser 232A configured to emit a blue light and an optical coupler 232B configured to couple the blue light from the blue laser 232A to the scanner 206. The red unit 220 includes a red laser 222A configured to emit a red light and an optical coupler 222B configured to couple the red light from the blue laser 222A to the scanner 206. The red laser 222A, the blue laser 232A and the infrared laser 242A are controlled by a laser controller 202.

Figure 8:
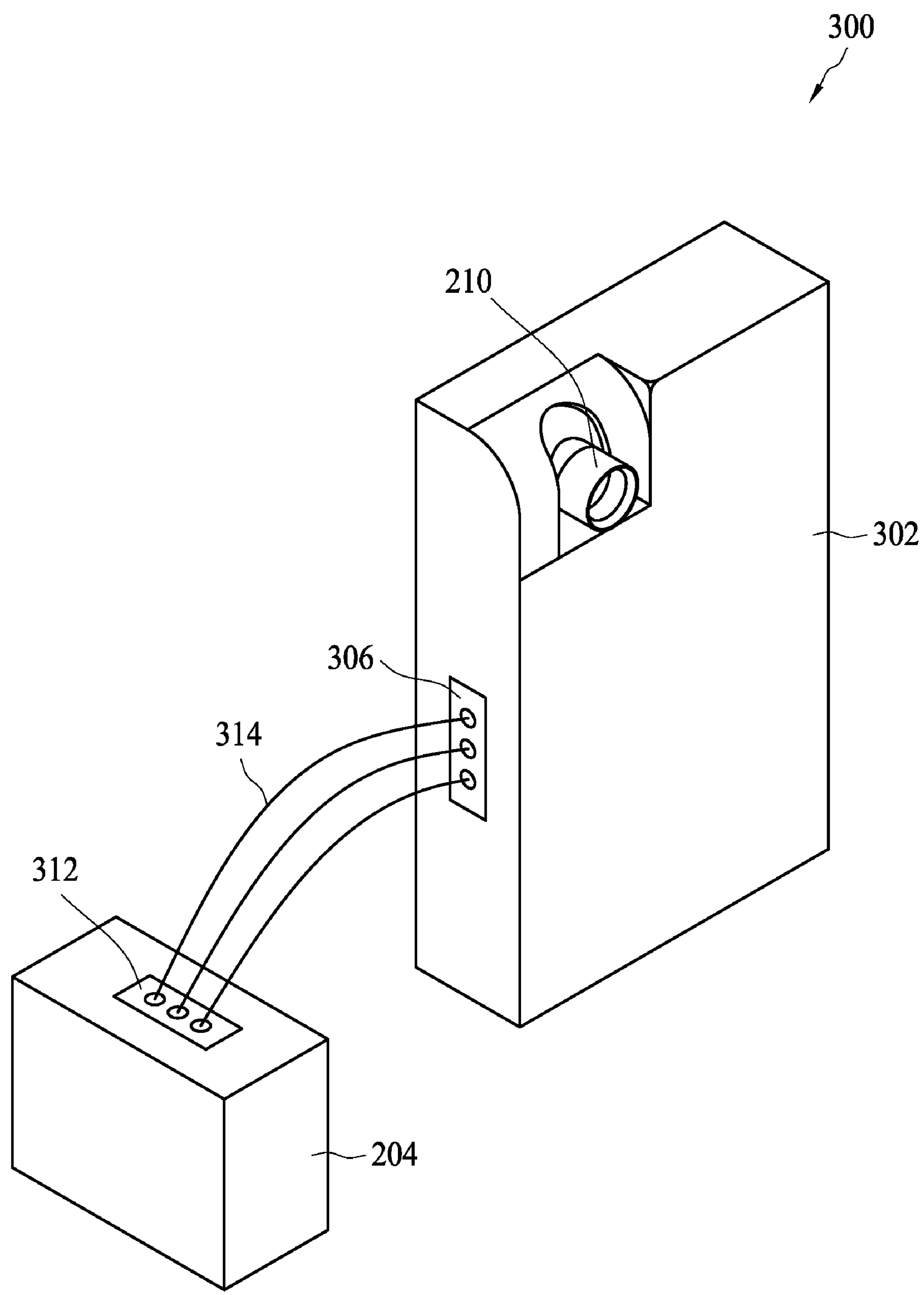
FIG. 8 illustrates a projection apparatus according to another embodiment of the present invention.

FIG. 8 illustrates a projection apparatus 300 according to another embodiment of the present invention. The projection apparatus 300 comprises a housing 302, and the projection head 210 is positioned on the housing 302 in a rotational manner. In addition, the housing 302 also includes an optical coupler 306, the light source 204 includes an optical coupler 312, and fibers 314 are used to connect the optical coupler 306 and the optical coupler 312 for transmitting the green light, the blue light and the red light from the light source 204 to the scanner 206 embedded in the housing 302. In particular, the light source 204 can be optionally embedded in the housing 302 as well.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A projection apparatus, comprising a light source including a green unit configured to emit a green light, a blue unit configured to emit a blue light and red unit configured to emit a red light, wherein the green unit includes an infrared laser configured to emit an infrared light and a wavelength converter configured to convert the infrared light into a green light, the wavelength converter includes a supporting substrate and a ferroelectric substrate, and the ferroelectric substrate includes at least one waveguide facing the supporting substrate.

2. The projection apparatus of claim 1, wherein the light source further comprises a fiber lens configured to couple the infrared light to the wavelength converter.

3. The projection apparatus of claim 1, further comprising a scanner and a projection head, wherein the scanner is configured to reflect the green light, the blue light and the red light onto a display screen via the projection head.

4. The projection apparatus of claim 3, further comprising a housing, wherein the projection head is positioned on the housing in a rotational manner.

5. The projection apparatus of claim 3, wherein the light source is embedded in the housing.

6. The projection apparatus of claim 3, wherein the housing includes an optical coupler configured to receive the green light, the blue light and the red light from the light source.

7. The projection apparatus of claim 1, wherein the light source further comprises a beam combiner configured to combine the green light, the blue light and the red light to produce a white light.

8. The projection apparatus of claim 1, wherein the waveguide includes a plurality of inverted domains and non-inverted domains configured to convert the infrared light into the green light.

9. The projection apparatus of claim 1, wherein the wavelength-filtering pattern includes a Bragg grating.

10. The projection apparatus of claim 9, wherein the Bragg grating is directly on the waveguide.

11. The projection apparatus of claim 1, wherein the ferroelectric substrate is joined to the supporting substrate via an adhesive.

12. The projection apparatus of claim 11, wherein the refraction index of the adhesive is lower than the refraction index of the ferroelectric substrate.

13. The projection apparatus of claim 1, wherein the ferroelectric substrate includes at least one wavelength-filtering pattern between the waveguide and the supporting substrate.

14. The projection apparatus of claim 1, wherein the waveguide is a ridge waveguide.

* * * * *